(12) United States Patent
Antonyan

(10) Patent No.: US 11,017,829 B2
(45) Date of Patent: May 25, 2021

(54) MAGNETIC MEMORY DEVICE INCLUDING VOLTAGE GENERATOR CONNECTED TO BOTH WORD LINE DRIVER AND WRITE DRIVER

(71) Applicant: Samsung Electronics Co., Ltd., Suwon-si (KR)

(72) Inventor: Artur Antonyan, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/582,273

(22) Filed: Sep. 25, 2019

(65) Prior Publication Data

US 2020/0321041 A1    Oct. 8, 2020

(30) Foreign Application Priority Data

Apr. 2, 2019 (KR) .................. 10-2019-0038142

(51) Int. Cl.
*G11C 11/16* (2006.01)
*G11C 5/14* (2006.01)

(52) U.S. Cl.
CPC .......... *G11C 11/1697* (2013.01); *G11C 5/145* (2013.01); *G11C 5/147* (2013.01); *G11C 11/1655* (2013.01); *G11C 11/1657* (2013.01); *G11C 11/1675* (2013.01)

(58) Field of Classification Search
CPC ............ G11C 11/1697; G11C 11/1675; G11C 11/1655; G11C 5/147; G11C 11/1657; G11C 5/145
See application file for complete search history.

(56) References Cited

U.S. PATENT DOCUMENTS

| | | | |
|---|---|---|---|
| 7,515,457 B2 | 4/2009 | Chen et al. | |
| 7,525,853 B2 | 4/2009 | Kitazaki et al. | |
| 7,986,557 B2 | 7/2011 | Tokiwa et al. | |
| 9,230,636 B2 | 1/2016 | Meinerzhagen et al. | |
| 9,378,797 B2 | 6/2016 | Antonyan | |
| 10,762,932 B2 * | 9/2020 | Antonyan ................ | G11C 8/08 |
| 2007/0291531 A1 | 12/2007 | Nahas | |
| 2018/0012640 A1 * | 1/2018 | Osada ................ | G11C 13/0026 |
| 2018/0075890 A1 * | 3/2018 | Inaba .................. | G11C 11/1655 |

FOREIGN PATENT DOCUMENTS

| | | |
|---|---|---|
| JP | 2012164400 A | 8/2012 |
| KR | 101310075 B1 | 9/2013 |

* cited by examiner

*Primary Examiner* — David Lam
(74) *Attorney, Agent, or Firm* — Harness, Dickey & Pierce, P.L.C.

(57) ABSTRACT

A magnetic memory devices including a memory cell array including magnetic memory cells, a voltage generator configured to generate a gate voltage, a row decoder including a word line driver, the word line driver configured to be driven by the gate voltage generated from the voltage generator, and the row decoder connected to the memory cell array through a word line, a column decoder connected to the memory cell array through a plurality of bit lines and a plurality of source lines, and a write driver configured to transfer a write voltage to a bit line selected, from among the plurality of bit lines, by the column decoder, the word line driver driven by the gate voltage generated from the voltage generator may be provided.

18 Claims, 13 Drawing Sheets

192

MAGNETIC MEMORY DEVICE INCLUDING VOLTAGE GENERATOR CONNECTED TO BOTH WORD LINE DRIVER AND WRITE DRIVER

CROSS-REFERENCE TO RELATED APPLICATION

This application claims the benefit of Korean Patent Application No. 10-2019-0038142, filed on Apr. 2, 2019, in the Korean Intellectual Property Office, the disclosure of which is incorporated herein in its entirety by reference.

BACKGROUND

1. Field

The present inventive concepts relate to magnetic memory devices.

2. Description of the Related Art

Nonvolatile memory devices using a resistance material include a phase change random access memory (PRAM), a resistive memory device (RRAM: resistive RAM), a magnetic memory device (MRAM: magnetic RAM), and the like. A dynamic memory device (DRAM: Dynamic RAM) and a flash memory device store data using a charge. Meanwhile, nonvolatile memory devices using the resistance material store data using a state change (PRAM) of a phase change material such as a chalcogenide alloy, a resistance change (RRAM) of a variable resistance material, a resistance change (MRAM) of an MTJ (Magnetic Tunnel Junction) thin film depending on a magnetization state of a ferromagnetic material, and the like.

MRAM (Magnetic Random Access Memory) devices have received attention due to high read and write speeds, a high durability, a non-volatility, and a low power consumption thereof while the operation is performed. The MRAM devices may store information, using a magnetic material as an information-storage medium.

SUMMARY

Aspects of the present inventive concepts provide magnetic memory devices with improved product reliability.

However, aspects of the present inventive concepts are not restricted to the one set forth herein. The above and other aspects of the present inventive concepts will become more apparent to one of ordinary skill in the art to which the present inventive concepts pertains by referencing the detailed description of some example embodiments given below.

According to an example embodiment of the present inventive concepts, a magnetic memory device may include a memory cell array including magnetic memory cells, a voltage generator configured to generate a gate voltage, a row decoder including a word line driver, the word line driver driven by the gate voltage generated from the voltage generator, is the row decoder connected to the memory cell array through a word line, a column decoder connected to the memory cell array through a plurality of bit lines and a plurality of source lines, and a write driver configured to transfer a write voltage to a bit line selected, from among the plurality of bit lines, by the column decoder, the write driver driven by the gate voltage generated from the voltage generator.

According to an example embodiment of the present inventive concepts, a magnetic memory device may include a magnetic memory cell including a variable resistance element and a selection transistor, a word line driver connected to a gate of the selection transistor, a write driver configured to transmit a write voltage to the selection transistor, and a voltage generator configured to apply a gate voltage to the word line driver and the write driver.

According to an example embodiment of the present inventive concepts, a magnetic memory device may include a memory cell array including magnetic memory cells, a word line, a bit line, and a source line connected to the memory cell array, a write driver connected to the bit line and the source line, the write driver configured to receive a gate voltage, a word line driver connected to the word line, the word line driver configured to receive the gate voltage, and a voltage generator configured to transmit the gate voltage to the word line driver and the write driver, the voltage generator may include a first transistor, a second transistor, a first gate of the first transistor being connected to the write driver, and a second gate of the second transistor being connected to the word line driver a switch block connected between the first and second transistors, and a charge pump configured to transmit the gate voltage to the first gate of the first transistor and the second gate of the second transistor.

BRIEF DESCRIPTION OF THE DRAWINGS

The above and other aspects and features of the present inventive concepts will become more apparent by describing in detail some example embodiments thereof with reference to the attached drawings, in which.

DETAILED DESCRIPTION

Figure 1:
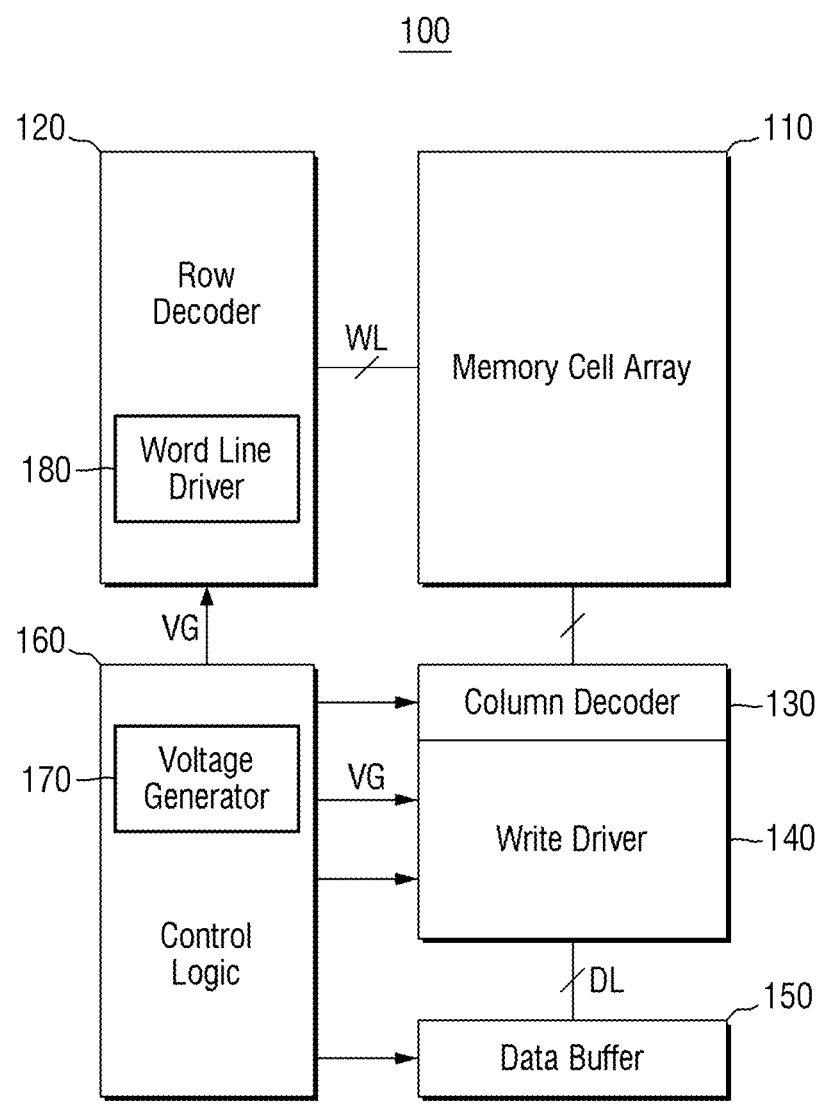
FIG. 1 is a block diagram illustrating a magnetic memory device according to an example embodiment.
Figure 2:
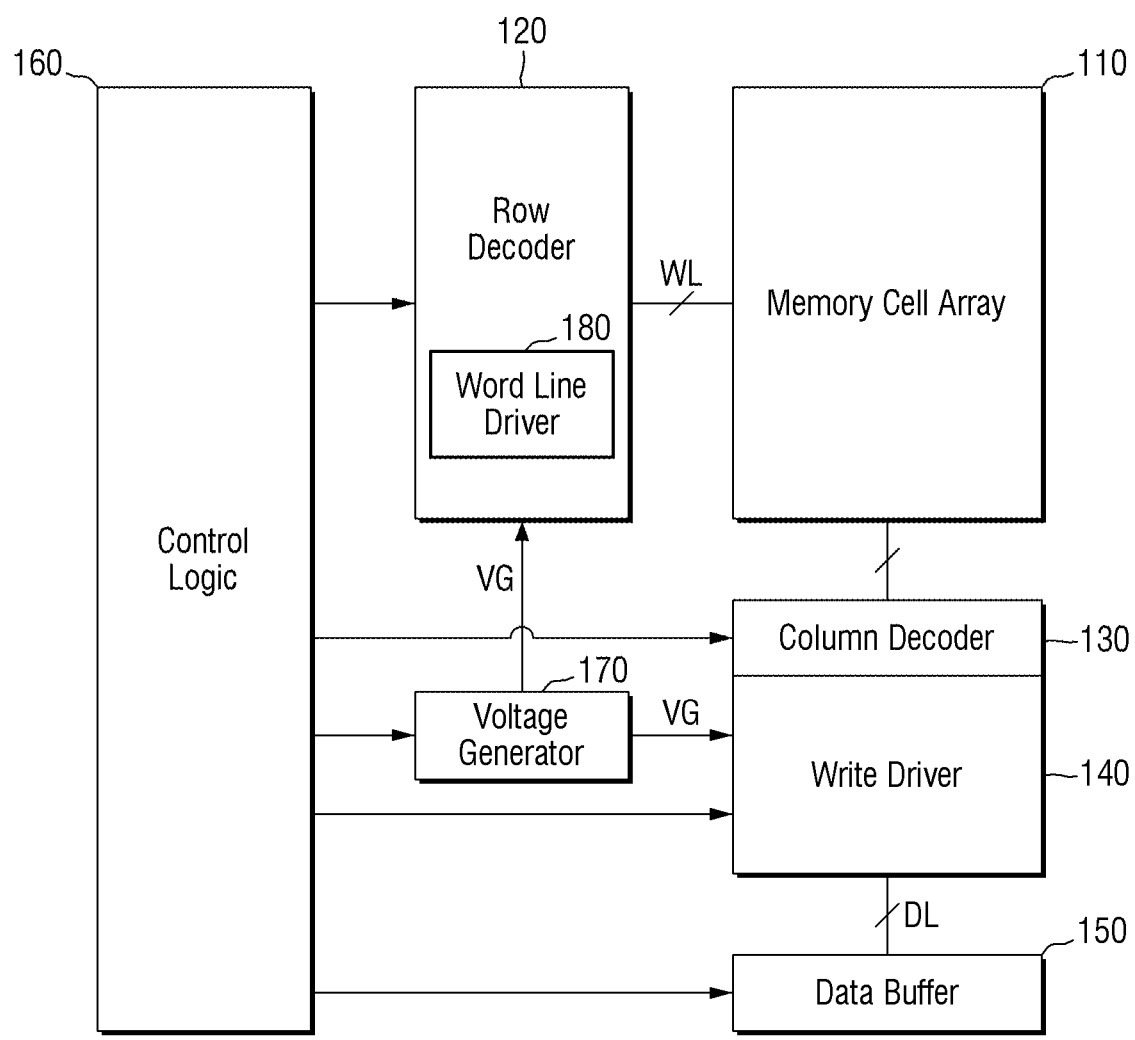
FIG. 2 is a block diagram illustrating another magnetic memory device according to an example embodiment.

FIG. 1 is a block diagram illustrating a magnetic memory device according to an example embodiment. FIG. 2 is a block diagram illustrating another magnetic memory device according to an example embodiment.

Referring to FIG. 1, the magnetic memory device 100 includes a memory cell array 110, a row decoder 120, a column decoder 130, a write driver 140, a data buffer 150, and a control logic 160. Also, the row decoder 120 may include a word line driver 180, and the control logic 160 may include a voltage generator 170.

The row decoder 120 may control the voltages of word lines WL in accordance with the control of the control logic 160. For example, the row decoder 120 may apply a selection voltage for reading or writing to a selected word line, and may apply a non-selection voltage (or voltages) for inhibiting reading or writing to other non-selected word lines. The row decoder 120 may be connected to the memory cell array 110 (e.g., memory cells in the memory cell array 110) through the word line WL.

The column decoder 130 may be connected to source lines and bit lines in the memory cell array 110. The column decoder 130 may be connected to the write driver. The column decoder 130 may electrically connect selected some source lines among the source lines and some selected bit lines among the bit lines to the write driver, in accordance with the control of the control logic 160.

The column decoder 130 may apply bias voltages to the remaining non-selected source lines among the source lines and the remaining non-selected bit lines among the bit lines, in accordance with the control of the control logic 160. The bias voltages may be defined not to affect the write or read operation on the selected memory cells connected to the selected word line, selected some bit lines and selected some source lines, and may include, for example, a ground voltage.

The voltage generator 170 included in the control logic 160 may generate a gate voltage VG. The gate voltage VG may be applied to the word line driver 180 in the row decoder 120 to drive the row decoder 120. Also, the gate voltage VG may be applied to the write driver 140 to drive the write driver 140.

The voltage generator 170 includes a charge pump or a set of charge pumps. That is, charge pumps associated with an operation of the row decoder 120 and an operation of the column decoder 130 may not be provided separately. In other words, one charge pump one set of charge pumps may be provided in the voltage generator 170 and associated with both the operation of the row decoder 120 and the operation of the column decoder 130. The number of charge pumps is not limited to one. Thus, by configuring one charge pump or one set of a plurality of charge pumps associated with both the operation of the row decoder 120 and the operation of the column decoder 130, an area occupied by the charge pumps in the magnetic memory device 100 may be reduced. Further, standby power consumption of the standby time generated during the write operation may be reduced.

When a state of the particular memory cell is the same as a state indicated by the data to be written on the particular memory cell, the write driver associated with the particular memory cell may maintain the state of the particular memory cell without change. When maintaining the data of the particular memory cell without change, the write driver associated with the particular memory cell may transfer a write inhibition voltage (e.g., the ground voltage) to the source line and the bit line associated with the particular memory cell.

At the time of the write operation, the write driver 140 may receive and driven by a gate voltage VG generated from the voltage generator 170, a write active signal and an inverted write active signal from the control logic 160. The write driver may output the write voltage in response to the gate voltage VG, the write active signal, and the inverted write active signal.

For example, the write driver 140 may transfer the write voltage to the selected bit lines or the selected source lines. For example, at the time of a write operation that transitions the states of the memory cells from first states (e.g., a low-resistance or high-resistance state) to second states (e.g., a high-resistance or low-resistance state), the write driver 140 may transfer the write voltage to the selected bit lines that are selected by the column decoder 130.

For example, the write driver 140 may transfer the write voltage to the source lines, at the time of the write operation of transitioning the states of the memory cells from the second states to the first states.

The data buffer 150 may be connected to the write driver via the data lines DL. The data buffer 150 may exchange data with an external device (e.g., a memory controller) in accordance with the control of the control logic 160. For example, at the time of the write operation, the data buffer 150 may transfer data received from an external device to the write driver 140. At the time of a read operation, the data buffer 150 may output data transferred from detection amplifiers (not illustrated) in the write driver 140 to the external device.

The control logic 160 may receive control signals and addresses from an external device (e.g., a memory controller). In response to the control signals and the address, the control logic may control the row decoder, the column decoder, the write driver, and the data buffers to perform the write operation and/or the read operation.

The control logic 160 may provide the write active signal and the inverted write active signal to the write driver. The write active signal and the inverted write active signal may be complementary signals, but are not limited thereto. When performing the write operation, the control logic 160 may control the write active signal to a high level and may control the inverted write active signal to a low level.

The control logic 160 may include a voltage generator 170. The voltage generator 170 may generate a gate voltage VG at the time of the write operation. The gate voltage VG may be transferred to the write driver 140 and the word line driver 180. The gate voltage VG may be used to generate the write voltage by the write driver. Further, the gate voltage VG drives a word line driver, and may be used to select a word line by the row decoder 120. The gate voltage VG may have a level higher than a level of the write voltage or the power supply voltage of the magnetic memory device 100.

The write driver 140 may generate the write voltages with the same level, using the gate voltage VG. Because the gate voltage VG is higher than the write voltage or the power supply voltage, the write driver 140 may generate a write voltage having a level approximate to the level of the power supply voltage.

Referring to an example embodiment illustrated in FIG. 2, a voltage generator 170 may exist outside the control logic 160 unlike the example embodiment illustrated in FIG. 1. Repeated description of FIG. 1 will not be provided, and differences will be mainly described.

At the time of the write operation, the voltage generator 170 may receive an operating signal from the control logic 160, and generate the gate voltage VG. The gate voltage VG may be transmitted to the word line driver 180 and the write driver 140.

The voltage generator 170 includes a charge pump or a set of charge pumps. That is, charge pumps associated with an operation of the row decoder 120 and an operation of the column decoder 130 may not be provided separately. In other words, one charge pump or one set of charge pumps may be provided in the voltage generator 170 associated with both the operation of the row decoder 120 and the operation of the column decoder 130. The number of charge pumps is not limited to one. Thus, by configuring one charge pump or one set of a plurality of charge pumps associated with both the operation of the row decoder 120 and the operation of the column decoder 130, the area occupied by the charge pumps in the magnetic memory device 100 may be reduced. Further, it is possible to reduce standby power consumption of the standby time generated at the time of the write operation may be reduced.

Figure 3:
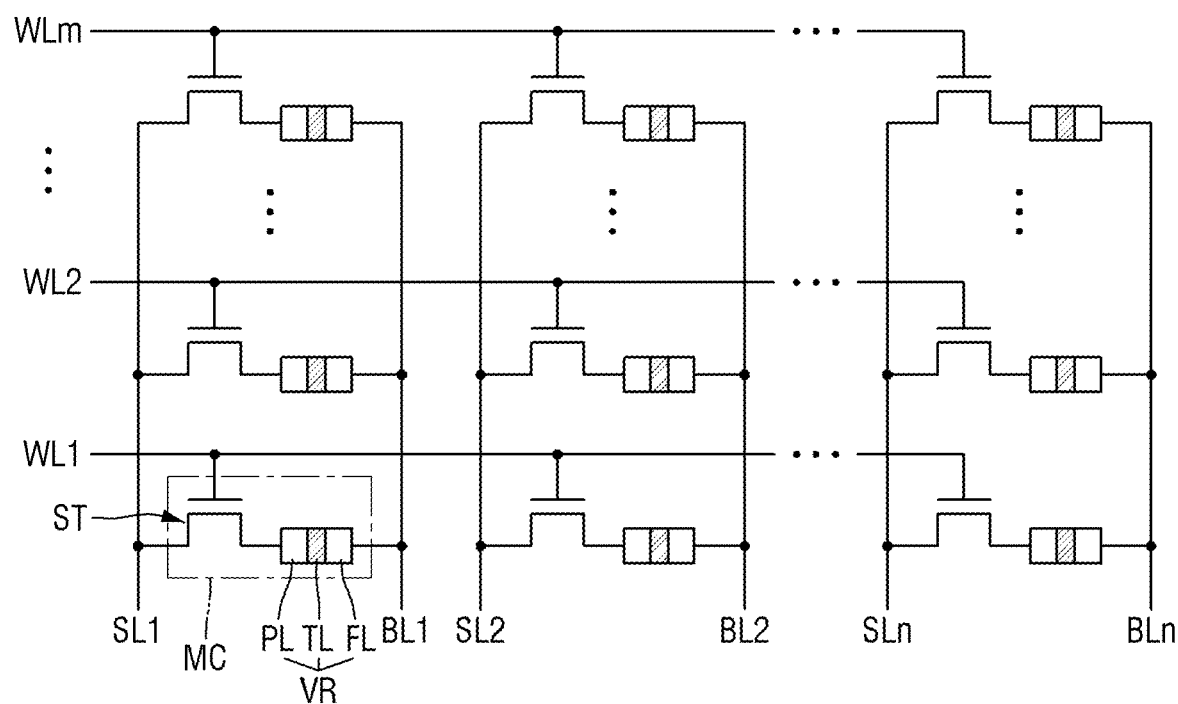
FIG. 3 is a diagram illustrating a memory cell array of the magnetic memory device according to an example embodiment.
Figure 4:
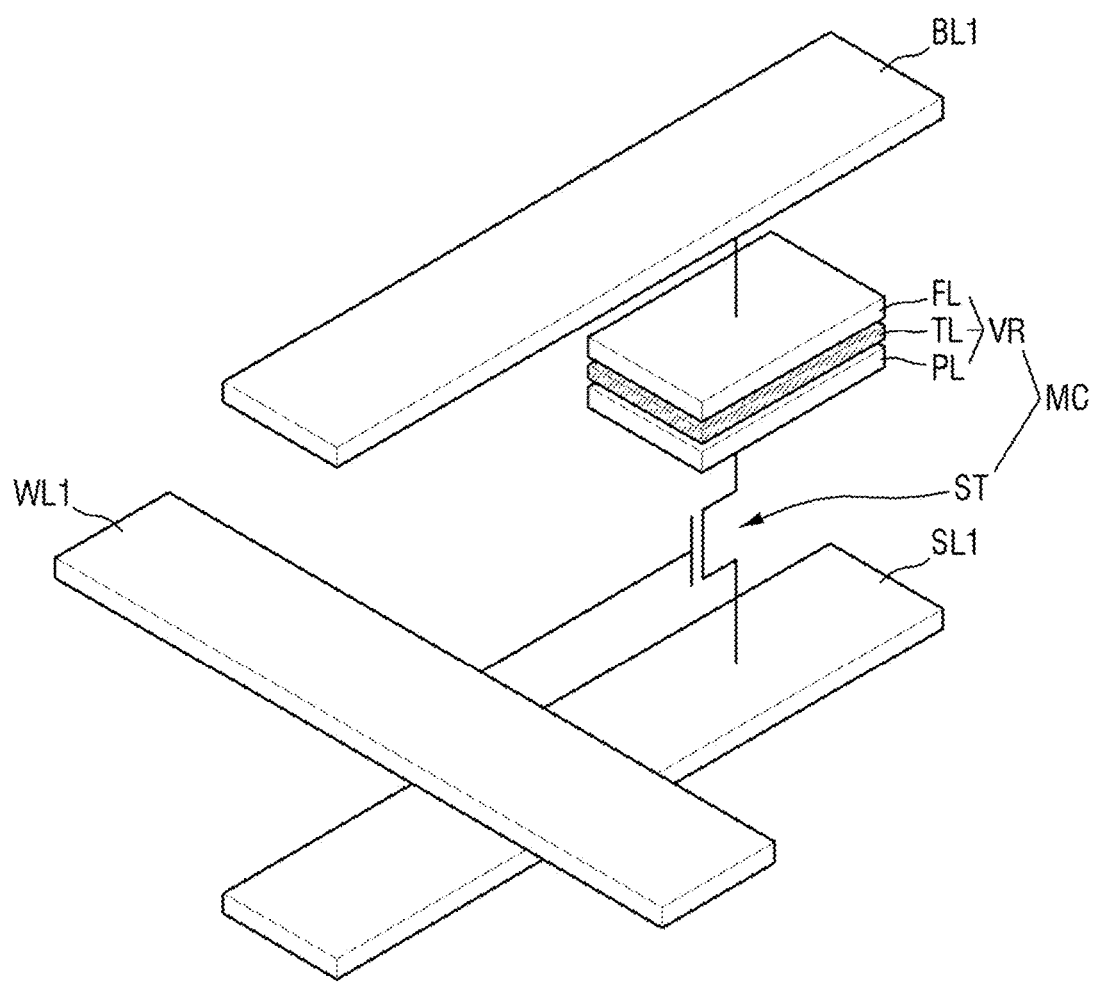
FIG. 4 is a diagram illustrating a memory cell of the memory cell array according to an example embodiment.

FIG. 3 is a diagram illustrating a memory cell array of the magnetic memory device according to an example embodiment. FIG. 4 is a diagram illustrating a memory cell of the memory cell array according to an example embodiment.

Referring to FIGS. 1, 3 and 4, the memory cell array 110 includes memory cells MC.

The memory cells MC may be connected to source lines (SL1 to SLn) (n is a positive integer), bit lines (BL1 to BLn), and word lines (WL1 to WLm) (m is a positive integer). The memory cells MC may be arranged in the rows and the columns. The rows of the memory cells MC may be connected to the word lines (WL1 to WLm), respectively. The columns of the memory cells MC may be connected to the source lines (SL1 to SLn) and the bit lines (BL1 to BLn), respectively. The voltages of the word lines (WL1 to WLm) may be controlled through the row decoder 120 under the control of the control logic 160. The bit lines (BL1 to BLn) and the source lines (SL1 to SLn) may be connected to the column decoder 130.

One memory cell MC may include a selection transistor ST and a variable resistive element VR.

The selection transistor ST includes a first junction connected to each of the source lines (SL1 to SLn), a second junction connected to each of the bit lines (BL1 to BLn) through the variable resistive element VR, and a gate connected to each of the word lines (WL1 to WLm) between the first and second junctions.

For example, the gate of the selection transistor ST may be connected to the first word line WL1. One electrode of the selection transistor ST may be connected to the first bit line BL1 through the variable resistive element VR. Further, the other electrode of the selection transistor ST may be connected to the first source line SL1.

The variable resistive element VR includes a pinned layer PL, a tunneling layer TL, and a free layer FL. The pinned layer PL may have a magnetization direction. The free layer FL may have a magnetization direction that changes depending on a voltage (or a current) applied to the variable resistive element VR.

The resistance of the variable resistance element VR may change depending on whether the magnetization direction of the free layer FL is the same as or different from the magnetization direction of the pinned layer PL or depending on whether the magnitude of the difference between the magnetization direction of the free layer FL and the magnetization direction of the pinned layer PL. The variable resistive element VR may store data in the form of a magnitude of resistance. Details of the write operation will be described through FIG. 5 and/or FIG. 6 to be described later.

Figure 5:
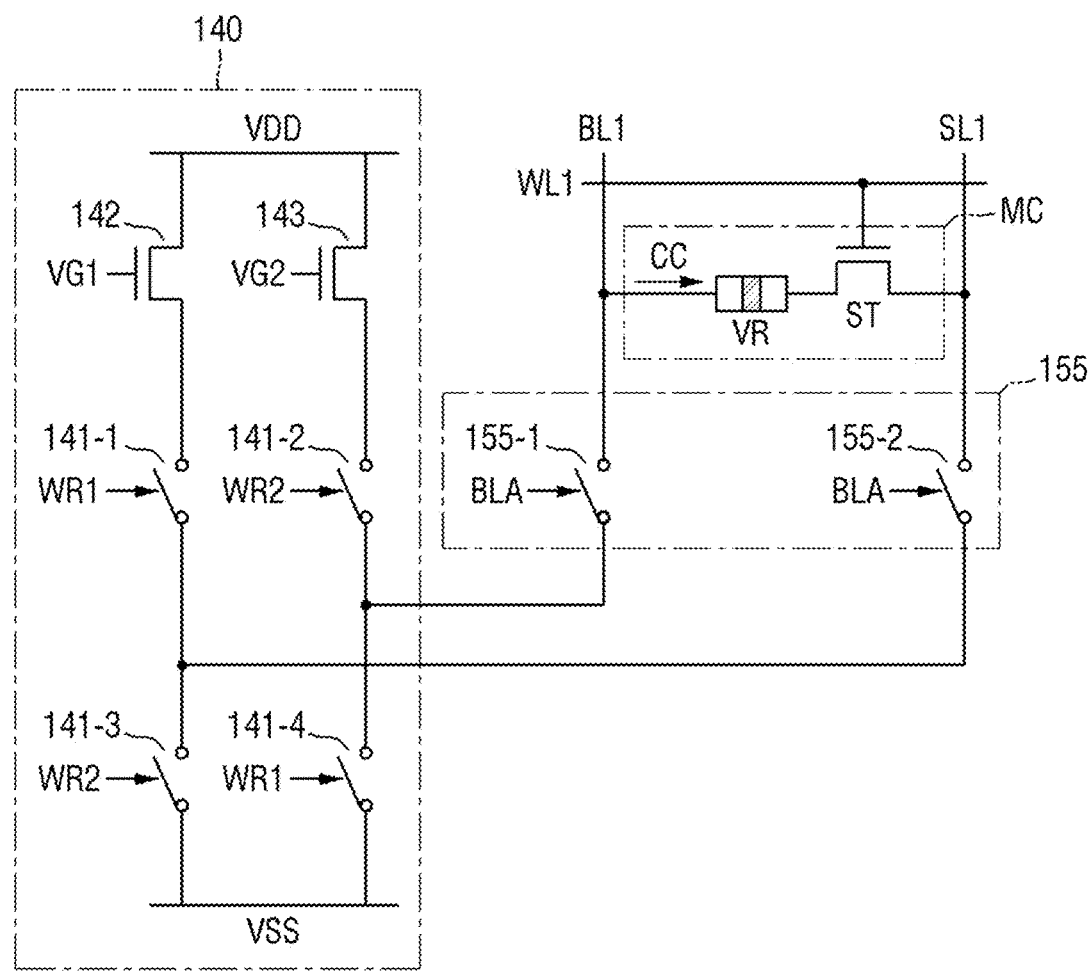
FIG. 5 is a diagram illustrating the write operation of the magnetic memory device according to an example embodiment.

FIG. 5 is a diagram illustrating the write operation of the magnetic memory device according to an example embodiment.

Referring to FIGS. 1, 3 and 5, the write driver 140, the bit line control circuit 155, and the memory cell MC may be connected through a first bit line BL1 and a first source line SL1.

The bit line control circuit 155 may be included in the memory cell array 110 or the write driver 140, but is not limited thereto.

The memory cell MC may be connected to the first bit line BL1 and the first source line SL1 and a first word line WL1. The same operation may be equally applied to memory cells connected to other bit lines (e.g., second to nth bit lines) and other word lines (e.g., second to mth word lines).

When the first word line WL1 is activated, because the selection transistor ST is activated, the first bit line BL1 and the first source line SL1 may be connected through the memory cell MC. At this time, a cell current CC flowing to the memory cell MC may be generated. In the case of the write operation, data may be recorded by the cell current CC, and in the case of the read operation, the data may be read by sensing the cell current CC. However, the present inventive concepts are not limited thereto.

The bit line control circuit 155 may include a first bit line switch 155-1 and a second bit line switch 155-2 that control each of the bit lines (BL1 to BLn) and the source lines (SL1 to SLn) in accordance with a bit line control signal BLA.

For example, because the first bit line switch 155-1 and the second bit line switch 155-2 enter the ON-state, on the basis of the bit line control signal BLA that is input from the control logic 160, the bit line control circuit 155 may activate the first bit line BL1 and the first source line SL1. Hereinafter, in order to describe the write operation of the memory cell MC, it is assumed that the first bit line switch 155-1 and the second bit line switch 155-2 of the bit line control circuit 155 are in the ON-state.

The write driver 140 may be connected to the memory cell MC through the first bit line BL1 and the first source line SL1. The memory cell MC may store data of 0 or 1 in accordance with the control of the write driver 140.

The write driver 140 may record data of 0 or 1 on the memory cell MC, using the first gate voltage VG1 and/or the second gate voltage VG2 that are input from the voltage generator 170, and the first write control signal WR1 and/or the second write control signal WR2 that are input from the control logic 160.

The write driver 140 may include a first write controller 142, a second write controller 143 and write switches 141-1 to 141-4. The first write controller 142 and/or the second write controller 143 is illustrated as a transistor, but the present inventive concepts are not limited thereto. The write switches 141-1 to 141-4 are illustrated as switches, but the present inventive concept are not limited thereto.

The first write switch 141-1 and the fourth write switch 141-4 may be controlled by a first write control signal WR1. The second write switch 141-2 and the third write switch 141-3 may be controlled by a second write control signal WR2. For example, the first write control signal WR1 may be a signal applied when recording data 1, and the second write signal may be a signal applied when recording data 0.

When one of the first write control signal WR1 and the second write control signal WR2 is applied, the other thereof may not be applied. For example, when the second write control signal is applied, the first write control signal WR1 is not applied, and the cell current CC may flow from the first bit line BL1 to the first source line SL1. On the other hand, when the first write control signal WR1 is applied, the second write control signal WR2 is not applied, and the cell current CC may flow from the first source line SL1 to the first bit line BL1. However, write operations according to the present inventive concepts are not limited thereto.

When the first gate voltage VG1 and the first write control signal WR1 are applied to the write driver 140, one end of the first write controller 142 may be connected to the first drive voltage VDD, and the other end thereof may be connected to the first source line SL1. Further, the second drive voltage VSS may be connected to the first bit line BL1. At this time, the first write controller 142 may be controlled via the control logic 160 to adjust the cell current CC.

When the second gate voltage VG2 and the second write control signal WR2 are applied to the write driver 140, one end of the second write controller 143 may be connected to the first drive voltage VDD, and the other end thereof may be connected to the first bit line BL1. Further, the second drive voltage VSS may be connected to the first source line SL1. At this time, the second write controller 143 may be controlled through the control logic 160 to adjust the cell current CC.

Figure 6:
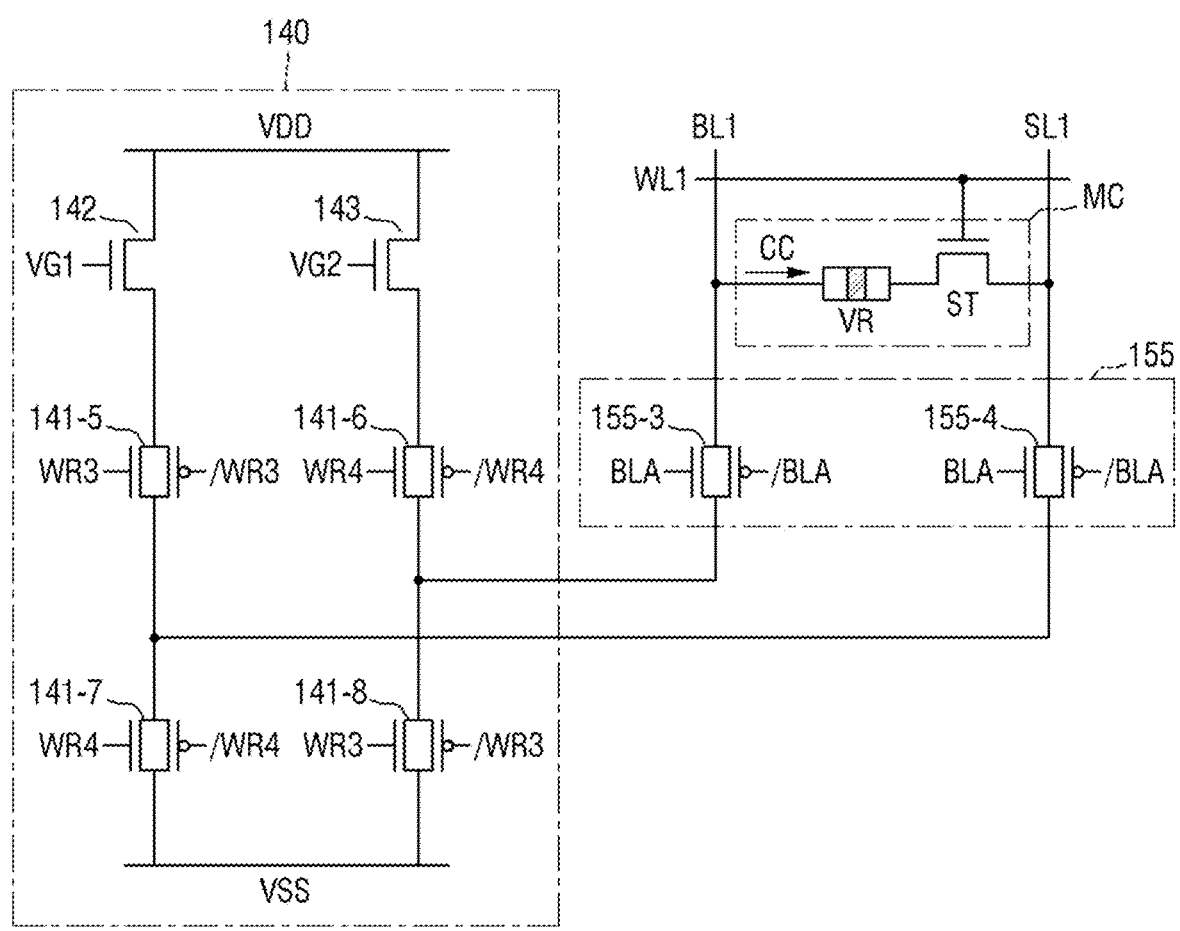
FIG. 6 is another diagram illustrating a write operation of the magnetic memory device according to an example embodiment.

FIG. 6 is another diagram illustrating a write operation of the magnetic memory device according to an example embodiment. For reference, the repeated description of FIG. 5 will not be provided, and the differences will be mainly described.

Referring to FIGS. 1, 3 and 6, the bit line control circuit 155 may include a third bit line switch 155-3 and a fourth bit line switch 155-4 that control each of the bit lines (BL1 to BLn) and the source lines (SL1 to SLn) in accordance with bit line control signals BLA and /BLA.

Each of the third bit line switch 155-3 and the fourth bit line switch 155-4 may be made up of a CMOS transmission gate, but is not limited thereto.

For example, when the third bit line switch 155-3 and the fourth bit line switch 155-4 enter the ON-state, on the basis of the bit line control signals BLA and /BLA that are input from the control logic 160, the bit line control circuit 155 may activate the first bit line BL1 and the first source line SL1. Hereinafter, it is assumed that the third bit line switch 155-3 and the fourth bit line switch 155-4 of the bit line control circuit 155 are in the ON-state to describe the write operation of the memory cell MC.

The write driver 140 may be connected to the memory cell MC through the first bit line BL1 and the first source line SL1. The memory cell MC may store data of 0 or 1 in accordance with the control of the write driver 140.

The write driver 140 may record data of 0 or 1 on the memory cell MC, through the first gate voltage VG1 and/or the second gate voltage VG2 that are input from the voltage generator 170, and the third write control signals WR3 and /WR3 and/or the fourth write control signals WR4 and /WR4 that are input from the control logic 160.

The write driver 140 may include a first write controller 142, a second write controller 143 and write switches 141-5 to 141-8. The first write controller 142 and/or the second write controller 143 are illustrated as a transistor, but the present inventive concepts are not limited thereto. The write switches 141-5 to 141-8 are illustrated as CMOS transmission gates, but the present inventive concepts are not limited thereto.

The fifth write switch 141-5 and the eighth write switch 141-8 may be controlled by the third write control signals WR3 and /WR3. The sixth write switch 141-6 and the seventh write switch 141-7 may be controlled by the fourth write control signals WR4 and /WR4. For example, the third write control signals WR3 and /WR3 may be signals applied when recording data 1, and the fourth write control signals WR4 and /WR4 may be signals applied when recording data 0.

At this time, in order to turn on the write switches 141-5 to 141-8, it is desired to turn on the gate of the NMOS and the gate of the PMOS constituting each of the write switches 141-5 to 141-8. In order to turn on the gate of the NMOS and the gate of the PMOS constituting each of the write switches 141-5 to 141-8, the write control signals entering the gate of the NMOS and the gate of the PMOS may have polarities different from each other. However, absolute magnitudes of the write control signals entering the gate of the NMOS and the gate of the PMOS may not be the same.

When one set of the third write control signals WR3 and /WR3 and the fourth write control signals WR4 and /WR4 is applied, the other set thereof may not be applied. For example, when the third write control signals WR3 and /WR3 are applied, the fourth write control signals WR4 and /WR4 may not be applied, and the cell current CC may flow from the first bit line BL1 to the first source line SL1. On the other hand, when the third write control signals WR3 and /WR3 are applied, the fourth write control signals WR4 and /WR4 may not be applied, and the cell current CC may flow from the first source line SL1 to the first bit line BL1. However, write operations according to the present inventive concepts are not limited thereto.

When the first gate voltage VG1 and the third write control signals WR3 and /WR3 are applied to the write driver 140, one end of the first write controller 142 may be connected to the first drive voltage VDD, and the other end thereof may be connected to the first source line SL1. Further, the second drive voltage VSS may be connected to the first bit line BL1. At this time, the first write controller 142 may be controlled through the control logic 160 to adjust the cell current CC.

When the second gate voltage VG2 and the fourth write control signals WR4 and /WR4 are applied to the write driver 140, one end of the second write controller 143 may be connected to the first drive voltage VDD, and the other end thereof may be connected to the first bit line BL1. Further, the second drive voltage VSS may be connected to the first source line SL1. At this time, the second write controller 143 may be controlled through the control logic 160 to adjust the cell current CC.

Figure 7:
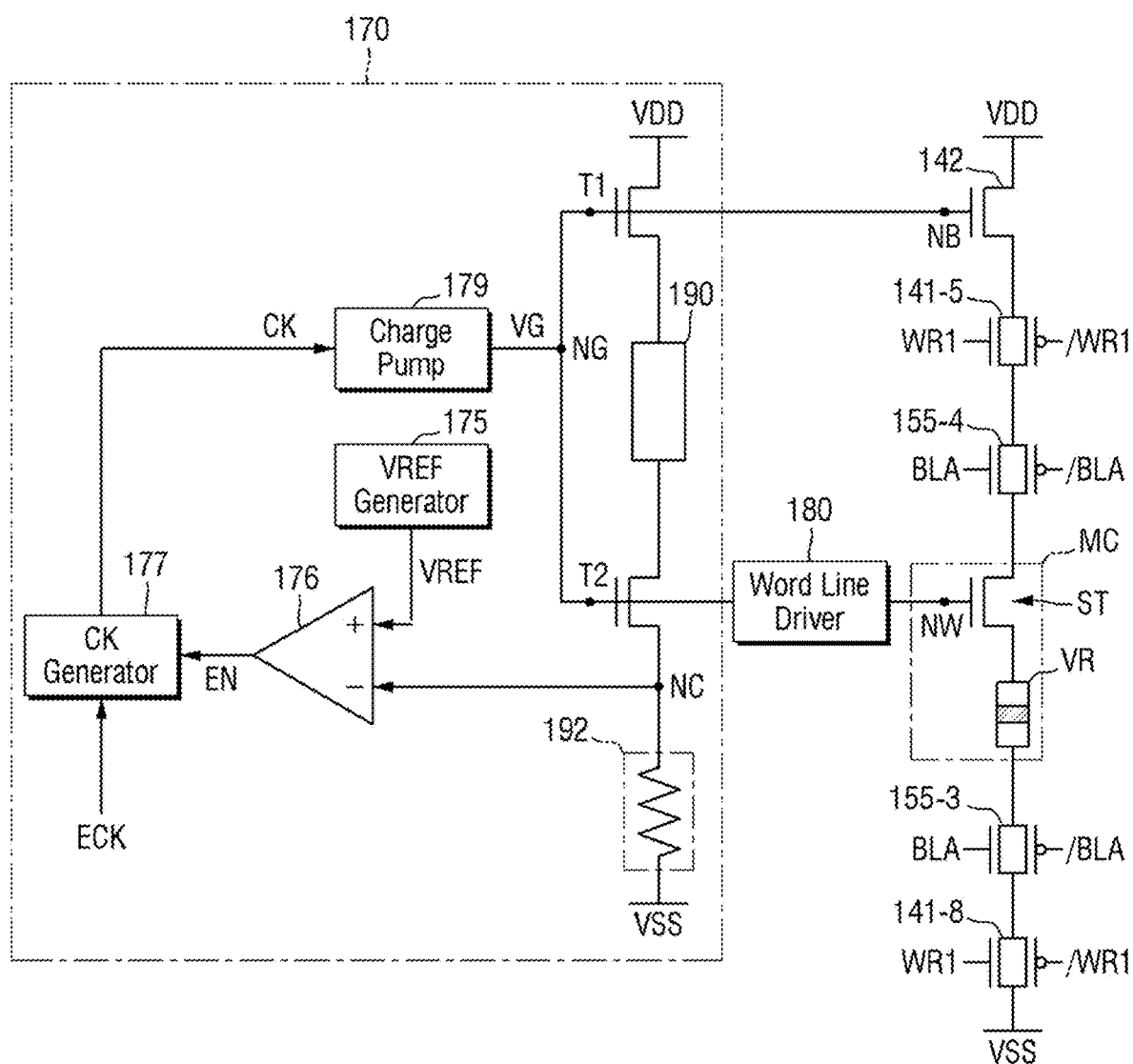
FIG. 7 is a diagram illustrating a voltage generator according to an example embodiment.
Figure 8:
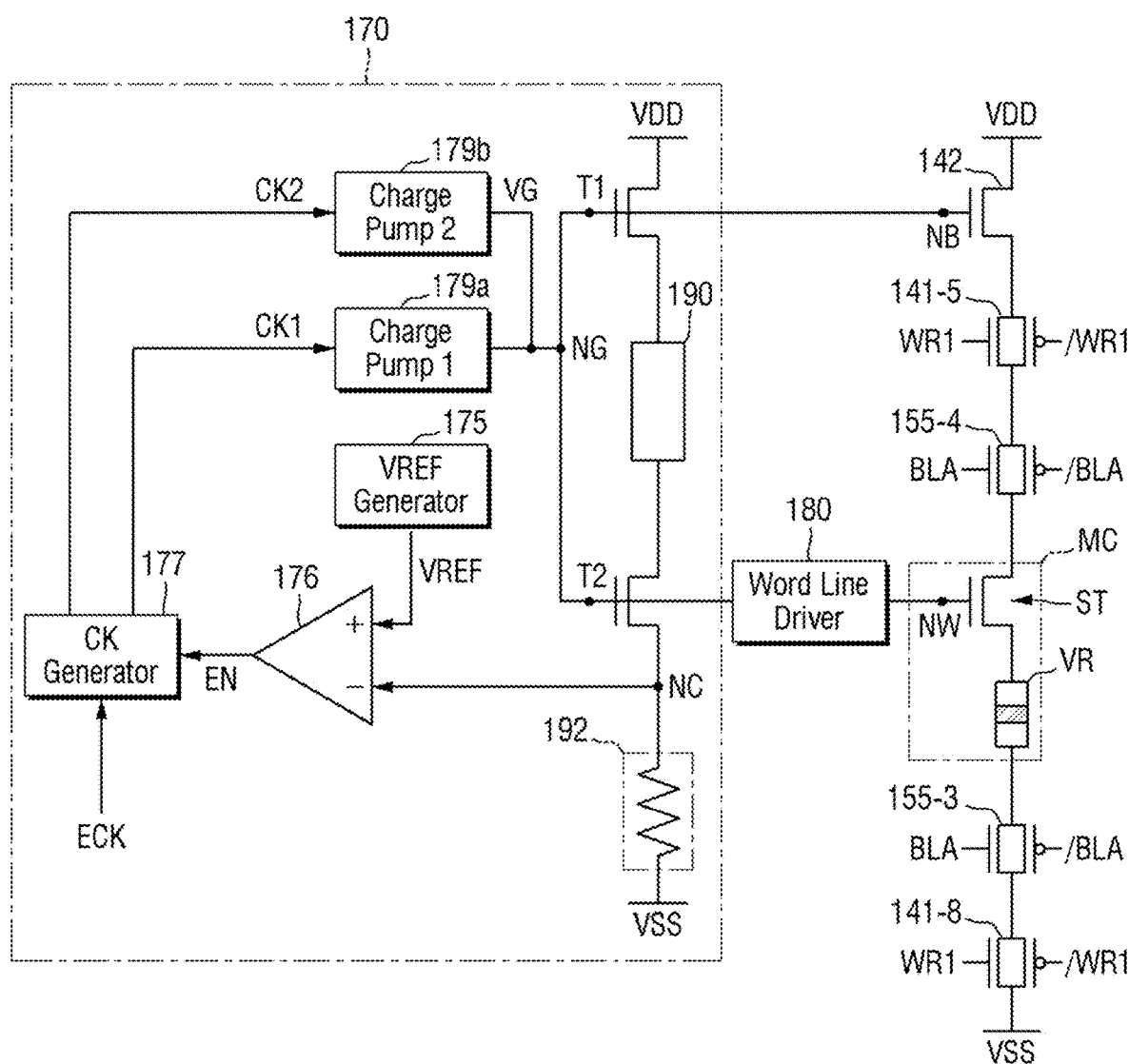
FIG. 8 is another diagram illustrating a voltage generator according to an example embodiment.
Figure 9:
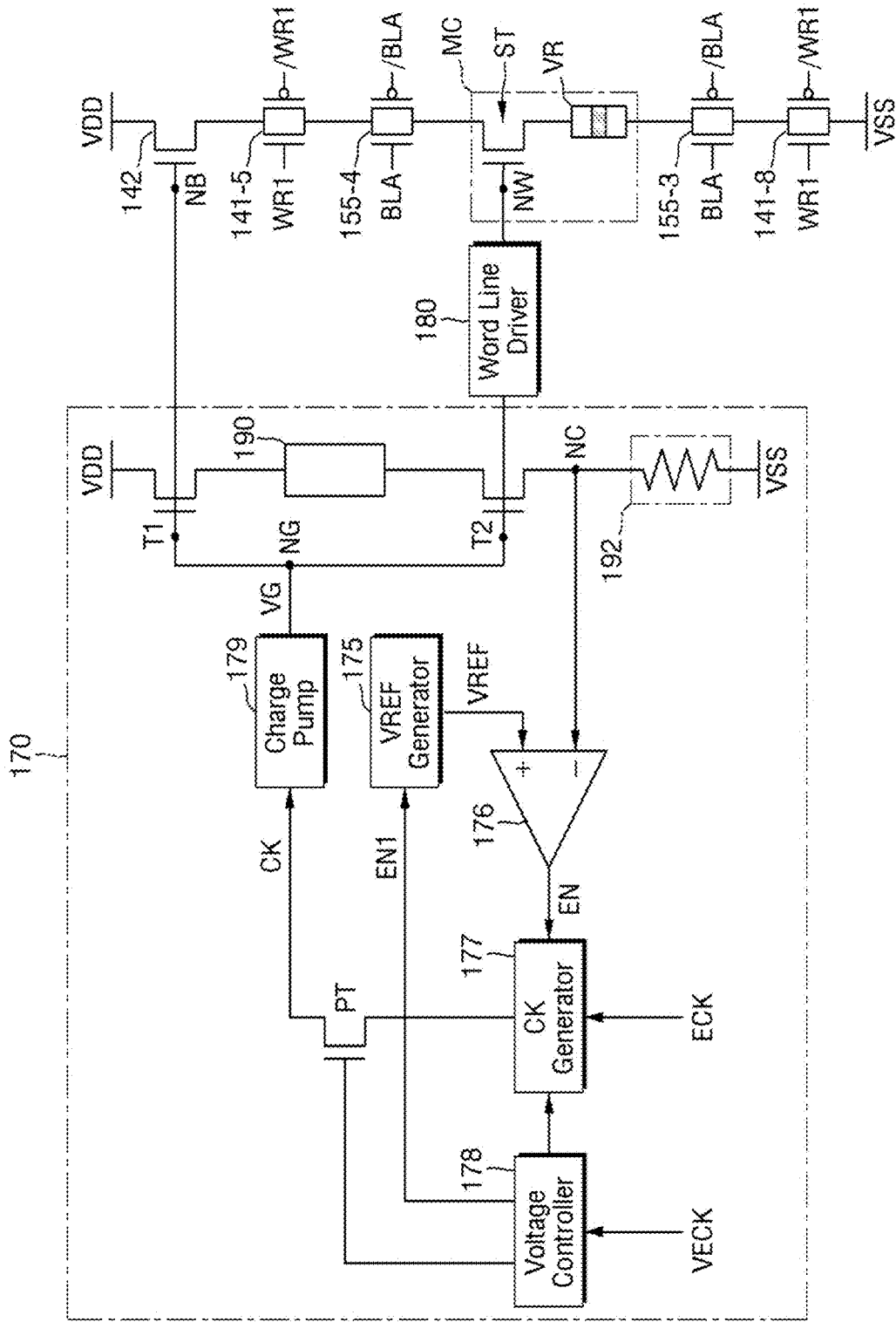
FIG. 9 is still another diagram illustrating a voltage generator according to an example embodiment.
Figure 10:
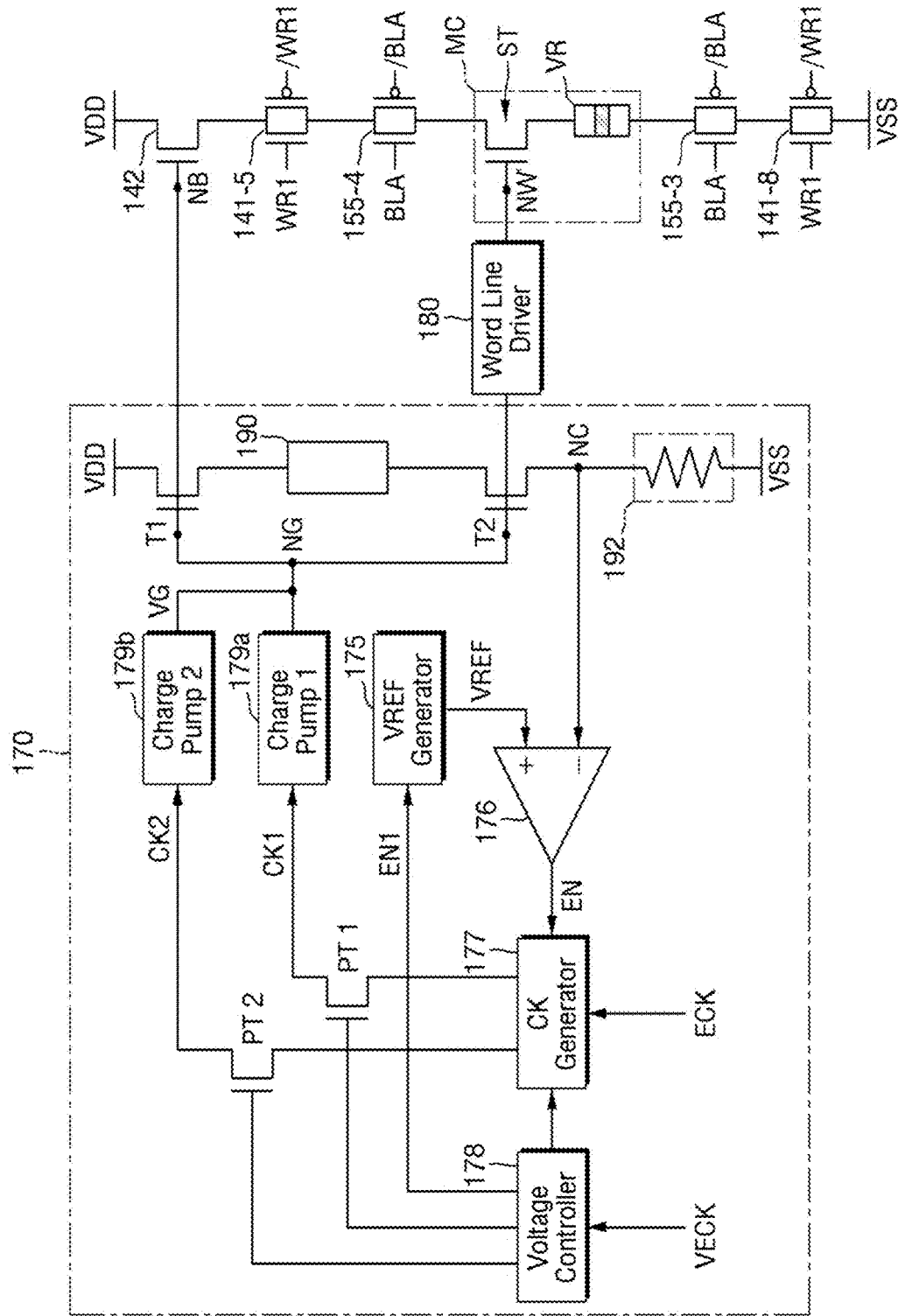
FIG. 10 is yet another diagram illustrating a voltage generator according to an example embodiment.

FIG. 7 is a diagram illustrating a voltage generator according to an example embodiment. FIG. 8 is another diagram illustrating a voltage generator according to an example embodiment. FIG. 9 is still another diagram illustrating a voltage generator according to an example embodiment. FIG. 10 is yet another diagram illustrating a voltage generator according to an example embodiment.

Referring to FIG. 7, the voltage generator 170 may include a first transistor T1, a second transistor T2, a comparator 176, a clock generator 177, a reference voltage generator 175, a charge pump 179, a switch block 190, and a variable resistance 192.

Hereinafter, a case where the first gate voltage VG1 and the third write control signals WR3 and /WR3 are applied to the write driver 140 will be assumed with reference to the write operation of FIG. 6. That is, a case will be assumed in which one end of the first write controller 142 is connected to the first drive voltage VDD, the other end thereof is connected to the first source line SL1, and the first drive voltage VDD is connected to the first source line SL1.

Referring again to FIG. 7, the voltage generator 170 may be connected to the word line driver 180 and the write driver 140.

For example, the gate of the first transistor T1 of the voltage generator 170 may be connected to the gate of the first write controller 142 in the write driver. Also, the gate of the second transistor T2 of the voltage generator 170 may be connected to the word line driver 180. That is, the second transistor T2 of the voltage generator 170 may be connected to the gate of the selection transistor ST of the memory cell MC through the word line driver 180.

The first transistor T1 includes a first end connected to the first drive voltage VDD, a second end connected to the switch block 190, and a gate connected to the gate node NG. The first transistor T1 may operate by receiving the gate voltage VG from the charge pump 179. Here, the gate voltage VG may be a second gate voltage VG2.

The first transistor T1 may be an NMOS transistor. That is, the first transistor T1 may form a source follower of the gate voltage VG. Thus, the first transistor T1 may have a relatively low output impedance, and relatively high controllability, and/or a relatively fast recovery speed, even without an element such as a capacitor occupying a large area.

The second transistor T2 includes a first end connected to the switch block 190, a second end connected to the variable resistance 192, and a gate connected to the gate node NG. The second transistor T2 may operate by receiving the gate voltage VG from the charge pump 179.

The variable resistance 192 may be connected between the comparison node NC and the second drive voltage VSS. The variable resistance 192 may be configured as illustrated in, for example, FIGS. 11 and 12, and the resistance value may be adjusted to have a minimum resistance value of the variable resistive element VR in the memory cell MC at the time of write operation. However, the present inventive concepts are not limited thereto. The variable resistance 192 may include a tunneling magnetoresistance including a pinned layer PL, a tunneling layer TL, and a free layer FL, like the variable resistive element VR.

The reference voltage generator 175 may output a reference voltage VREF. The reference voltage generator 175 may also adjust the level of the reference voltage VREF. The reference voltage VREF may be transferred to a positive input of the comparator 176.

The comparator 176 may compare the voltage of the comparison node NC with the reference voltage VREF. For example, when the voltage of the comparison node NC is equal to or higher than the reference voltage VREF, the comparator 176 may control the active signal EN to a low level. When the voltage of the comparison node NC becomes lower than the reference voltage VREF, the comparator 176 may control the active signal EN to a high level.

The clock generator 177 may receive an external clock signal ECK from an external device (e.g., a memory controller). For example, the external clock signal ECK may be received by being included in the control signal. That is, the clock generator 177 may generate the clock signal CK in response to the active signal EN and the external clock signal ECK.

For example, when the external clock signal ECK is transmitted to the clock generator 177 and the active signal EN is input from the comparator 176, the clock generator 177 may generate the clock signal CK and transmit it to the charge pump 179. On the contrary, if the external clock signal ECK or the active signal EN is not transmitted to the clock generator 177, the clock generator 177 may not output the clock signal CK.

The charge pump 179 may receive the clock signal CK to adjust the level of the gate voltage VG. For example, when the active signal EN becomes a high level, the charge pump 179 may improve the level of the gate voltage VG through the pumping. When the active signal EN becomes a low level, the charge pump 179 may stop the pumping and keep the level of the gate voltage VG in an original state.

The switch block 190 may include elements existing in a current path from the first drive voltage to the second drive voltage via the memory cell MC, when performing the write operation on a specific memory cell MC. For example, the switch block 190 may include switches or parasitic resistances existing between the write driver and the memory cell MC, and switches or parasitic resistances existing between the memory cell MC and the second drive voltage.

For example, the first write controller 142 may receive application of the gate voltage VG to output a voltage subtracted by a threshold voltage of the first write controller 142. The outputted subtracted voltage may be transmitted to the memory cell MC by a voltage distribution. The switch block 190 may be connected between the first transistor T1 and the second transistor T2 to reflect the aforementioned features in the voltage generator 170. The switch block 190 may include the first, second, third, and fourth switches 141-1, 141-2, 141-3, and 141-4, the bit line switch 155-1, and the source line switch 155-2, as illustrated in FIG. 5. Accordingly, the gate voltage VG that needs to be supplied to the word line driver 180 and the write driver 140 may be adjusted through the charge pump 179 in the voltage generator 170.

Referring to FIG. 8, the number of the charge pumps 179 in the voltage generator 170 may be two. That is, the voltage generator 170 may include a first charge pump 179a and a second charge pump 179b.

The first charge pump 179a may receive the first clock signal CK1 from the clock generator 177. The first charge pump 179a may pump the gate voltage VG in response to the first clock signal CK1. The second charge pump 179b may receive the second clock signal CK2 from the clock generator 177. The second charge pump 179b may pump the gate voltage VG in response to the second clock signal CK2. If the first clock signal CK1 and/or the second clock signal CK2 are not transmitted to the first charge pump 179a and/or the second charge pump 179b, the first charge pump 179a and/or the second charge pump 179b may stop the pumping. The pumping capacity of each of the first charge pump 179a and/or second charge pump 179b may be adjusted.

Referring to FIG. 9, a voltage controller 178 and a pump transistor PT may be further included in the voltage generator 170 of FIG. 7. For reference, the number of charge pumps and the number of pump transistors are not limited thereto. Repeated description of FIG. 7 will not be provided, and differences will be mainly described.

The first end of the pump transistor PT is connected to the charge pump 179, the second end is connected to the clock generator 177, and the gate of the pump transistor PT may be connected to the voltage controller 178.

The voltage controller 178 may receive a voltage clock signal VECK. For example, the voltage controller 178 may receive a command including the voltage clock signal VECK from an external device (e.g., a memory controller) at the time of the write operation, and apply a voltage to the gate of the pump transistor PT to turn on the pump transistor PT.

The voltage controller 178 may transmit a first active signal EN1 to the reference voltage generator 175, in accordance with information stored (or alternatively, received from) in the external device (e.g., a memory controller or other components in the control logic) or an internal storage.

That is, the voltage controller 178 may adjust the first active signal EN1 to adjust the reference voltage VREF generated from the reference voltage generator 175.

The voltage controller 178 may transmit an operating signal to the clock generator 177 to control the clock signal CK to be generated from the clock generator 177.

The clock generator 177 may receive an external clock signal ECK from an external device (e.g., a memory controller). For example, the external clock signal ECK may be received by being included in the control signal. That is, the clock generator 177 may generate the clock signal CK in response to the active signal EN, the external clock signal ECK, and the operating signal received from the voltage controller 178. The generated clock signal CK may be input to the pump transistor PT, and the clock signal CK may be transmitted to the charge pump 179 via the pump transistor PT.

Referring to FIG. 10, a voltage controller 178, a first pump transistor PT1 and a second pump transistor PT2 may be further included in the voltage generator 170 of FIG. 8. For reference, the number of charge pumps and the number of pump transistors are not limited thereto. Repeated description of FIGS. 8 and 9 will not be provided, and differences will be mainly described.

The first end of the first pump transistor PT1 is connected to the first charge pump 179a, the second end is connected to the clock generator 177, and the gate of the first pump transistor PT1 may be connected to the voltage controller 178. The first end of the second pump transistor PT2 is connected to the second charge pump 179b, the second end is connected to the clock generator 177, and the gate of the second pump transistor PT2 may be connected to the voltage controller 178.

The voltage controller 178 may receive the voltage clock signal VECK. For example, the voltage controller 178 may receive a command including the voltage clock signal VECK from an external device (e.g., a memory controller) at the time of the write operation, and may apply a voltage to the gate of the first pump transistor PT1 and/or the second pump transistor PT2 to turn on the first pump transistor PT1 and/or the second pump transistor PT2.

The clock generator 177 may receive the external clock signal ECK from an external device (e.g., a memory controller). For example, the external clock signal ECK may be received by being included in the control signal. That is, the clock generator 177 may generate the first clock signal CK1 and/or the second clock signal CK2 in response to the active signal EN, the external clock signal ECK, and an operating signal received from the voltage controller 178. The generated first clock signal CK1 and/or the second clock signal CK2 may be input to each of the first pump transistor PT1 and/or the second pump transistor PT2. The first clock signal CK1 and/or the second clock signal CK2 may be transmitted to each of the first charge pump 179a and/or the second charge pump 179b through each of the first pump transistor PT1 and/or the second pump transistor PT2.

According to the example embodiments (e.g., FIGS. 7-10) of the present inventive concepts, charge pumps are not separately provided with respect to the word line driver and the write driver. That is, one charge pump or one set of charge pumps may be provided as a single charge pump block included in the single voltage generator to apply a gate voltage to both the word line driver and the write driver. That is, the charge pump block may include one charge pump block or one set of a plurality of charge pump blocks, thereby reducing the area occupied by the charge pump in the magnetic memory device, and/or reducing the standby power consumption of the standby time generated during the write operation.

Figure 11:
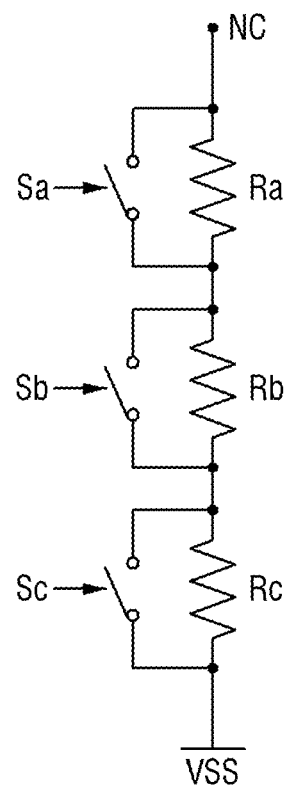
FIG. 11 is a diagram illustrating a variable resistance according to an example embodiment.

FIG. 11 is a diagram illustrating a variable resistance according to \ an example embodiment.

Referring to FIGS. 7 and 11, in the variable resistance 192, switches that are configured to be turned on/off in accordance with the first to third signals (Sa to Sc) having values different from each other, and the first to third resistors (Ra to Rc) connected in parallel to each of the first to third signals (Sa to Sc) may be connected between the comparison node NC and the second drive voltage VSS. However, the present inventive concepts are not limited thereto, and the configuration and number of resistances may be variously modified.

Figure 12:
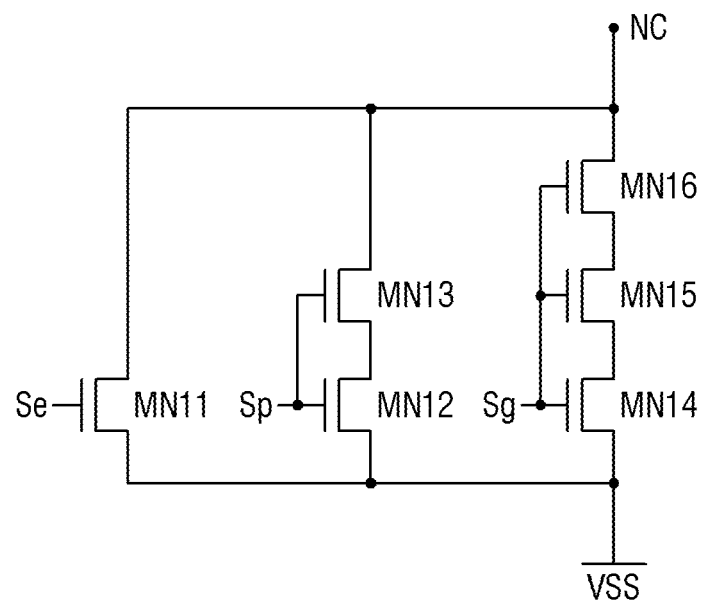
FIG. 12 is a diagram illustrating another variable resistance according to an example embodiment.

FIG. 12 is a diagram illustrating another variable resistance according to an example embodiment.

Referring to FIGS. 7 and 12, the variable resistance 192 may include a plurality of transistors (MN11 to MN16). In this case, the variable resistance 192 may include an on-resistance formed by turn-on of the transistors (MN11 to MN16).

For example, an eleventh transistor MN11 may be driven by a fourth signal Se, a twelfth transistor MN12 and a thirteenth transistor MN13 may be driven by a fifth signal Sp, and a fourteenth transistor MN14, a fifteenth transistor MN15 and a sixteenth transistor MN16 may be driven by a sixth signal Sg.

Figure 13:
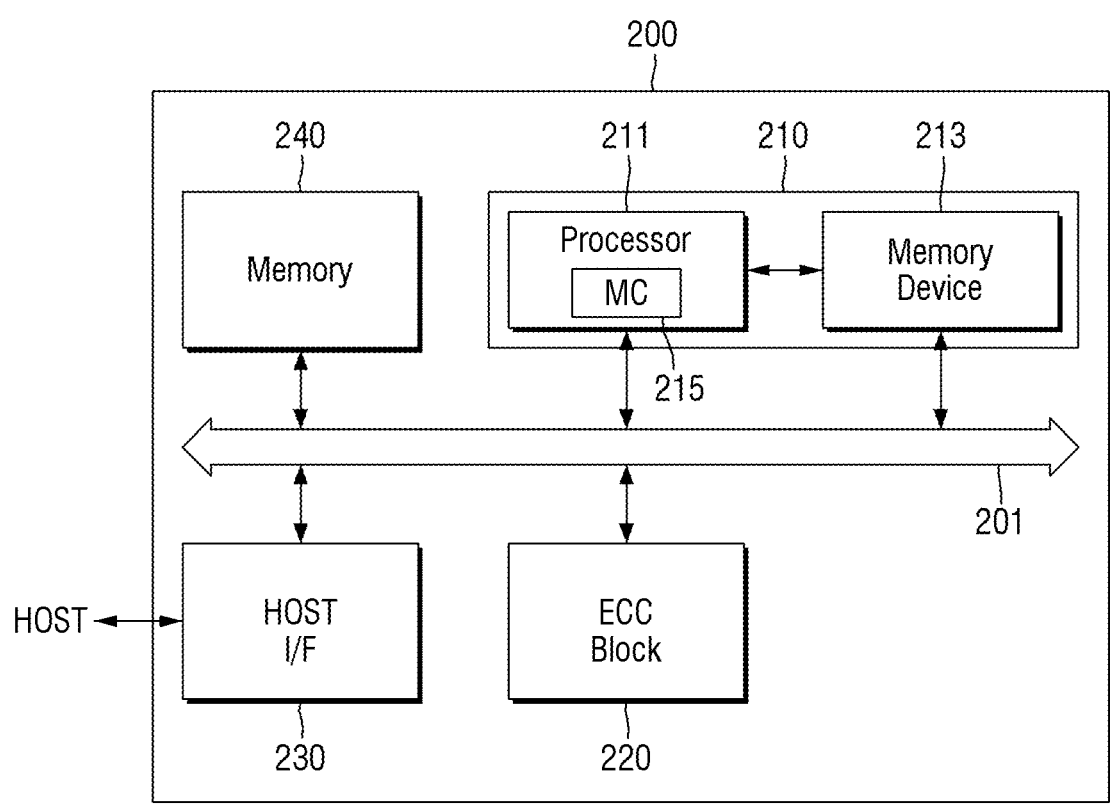
FIG. 13 is a block diagram illustrating a system including a magnetic memory device according to an example embodiment.

FIG. 13 is a block diagram illustrating a system including a magnetic memory device according to an example embodiment.

Referring to FIG. 13, a system 200 includes a processor 211 that may control the overall operation of the magnetic memory device 213. The magnetic memory device 213 may be the magnetic memory device 100 illustrated in FIG. 1.

The magnetic memory device 213 and the processor 211 may be packaged in a package 210. The package 210 may be mounted on a system board (not illustrated).

The processor 211 may include a memory controller 215 for controlling the operation of the magnetic memory device 213.

The system 200 may include a memory 240 that may be used as an operation memory of the processor 211. A host connected to the system may transmit and receive data to and from the magnetic memory device 213 through the processor 211 and the host interface 230. At this time, the memory controller 215 may perform the function of the memory interface. The system 200 may further include an error correction code (ECC) block 220.

The ECC block 220 operating under the control of the processor 211 may detect and correct an error included in data that is read from the magnetic memory device 213, through the memory controller 215.

The processor 211 may control the exchange of data between the ECC block 220, the host interface 230 and the memory 240 through a bus 201.

The system 200 may be implemented as a Universal Serial Bus (USB) memory drive or a memory stick.

The row decoder 120 including the word line driver 180, the column decoder 130, the controller logic 160, the processor 211, and/or the memory controller MC 215 described herein may be implemented using hardware and a combination of software and hardware. For example, the hardware may include microcontrollers, memory modules, sensors, amplifiers, band-pass filters, analog to digital converters, and processing devices, or the like. A processing device may be implemented using one or more hardware device(s) configured to carry out and/or execute program code by performing arithmetical, logical, and input/output operations. The processing device(s) may include a controller and an arithmetic logic unit, a digital signal processor, a microcomputer, a field programmable array, a programmable logic unit, a microprocessor or any other device capable of responding to and executing instructions in a defined manner. The processing device(s) may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a processing device may include multiple processors or a processor and a controller. In addition, different processing configurations are possible, such as parallel processors, multi-core processors, distributed processing, or the like.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, and/or computer storage medium or device. The software also may be distributed over network coupled computer systems so that the software is stored and executed in a distributed fashion. The software and data may be stored by one or more computer readable recording mediums.

In concluding the detailed description, those skilled in the art will appreciate that many variations and modifications may be made to the example embodiments disclosed herein without substantially departing from the principles of the present inventive concepts. Therefore, the disclosed example embodiments of the inventive concepts are used in a generic and descriptive sense only and not for purposes of limitations.

While the present inventive concepts have been particularly shown and described with reference to some example embodiments thereof, it will be understood by those of ordinary skill in the art that various changes in form and details may be made therein without departing from the spirit and scope of the present inventive concepts as defined by the following claims. It is therefore desired that the present example embodiments be considered in all respects as illustrative and not restrictive, reference being made to the appended claims rather than the foregoing description to indicate the scope of the inventive concepts.

What is claimed is:

1. A magnetic memory device comprising:
    a memory cell array including magnetic memory cells;
    a voltage generator configured to generate a gate voltage;
    a row decoder including a word line driver, the word line driver configured to be driven by the gate voltage generated from the voltage generator, the row decoder connected to the memory cell array through a word line;
    a column decoder connected to the memory cell array through a plurality of bit lines and a plurality of source lines; and
    a write driver configured to transfer a write voltage to a bit line selected, from among the plurality of bit lines, by the column decoder, the write driver driven by the gate voltage generated from the voltage generator,
    wherein the voltage generator comprises a first transistor and a second transistor,
    a first gate of the first transistor and a second gate of the second transistor are configured to receive the gate voltage,
    the first gate of the first transistor is connected to the write driver, and
    the second gate of the second transistor is connected to the word line driver.

2. The magnetic memory device of claim 1, wherein the voltage generator comprises a charge pump configured to generate the gate voltage.

3. The magnetic memory device of claim 2, wherein the voltage generator comprises a voltage controller configured to adjust an amount of pumping of the charge pump.

4. The magnetic memory device of claim 1, further comprising:
    a variable resistance between the second transistor and a ground.

5. The magnetic memory device of claim 4, wherein
    the variable resistance comprises a plurality of sub-variable resistances, and
    the plurality of sub-variable resistances is configured to be operated by respective ones of a plurality of switches, which are connected in parallel to the plurality of sub-variable resistances.

6. The magnetic memory device of claim 4, wherein
    the variable resistance comprises a plurality of sub-transistors, and
    the plurality of sub-transistors is turned on to adjust a total resistance of the variable resistance.

7. The magnetic memory device of claim 1, wherein the write driver comprises:
    a first switch and a second switch configured to be controlled by a first write control signal; and
    a third switch and a fourth switch configured to be controlled by a second write control signal.

8. The magnetic memory device of claim 7, further comprising:
    a bit line switch configured to be controlled by a switch signal, the bit line switch connected to the bit line, the bit line switch connected to the second switch and the third switch, and
    a source line switch configured to be controlled by the switch signal, the source line switch connected to the source line, the source line switch connected to the first switch and the fourth switch.

9. The magnetic memory device of claim 8, wherein
    the voltage generator further comprises a switch block between the first transistor and the second transistor, the switch block including the first switch, the second switch, the third switch, the fourth switch, the bit line switch, and the source line switch.

10. A magnetic memory device comprising:
    a magnetic memory cell including a variable resistance element and a selection transistor;
    a word line driver connected to a gate of the selection transistor;
    a write driver configured to transmit a write voltage to the selection transistor; and
    a voltage generator configured to apply a gate voltage to the word line driver and the write driver,
    wherein the voltage generator comprises a first transistor and a second transistor, and a first gate of the first transistor and a second gate of the second transistor are configured to receive the gate voltage, the first gate of the first transistor being connected to the write driver, the second gate of the second transistor being connected to the word line driver.

11. The magnetic memory device of claim 10, wherein the voltage generator comprises a charge pump configured to generate the gate voltage.

12. The magnetic memory device of claim 11, wherein the voltage generator comprises a voltage controller configured to adjust an amount of pumping of the charge pump.

13. The magnetic memory device of claim 10, further comprising:
a switch block between the first transistor and the second transistor, the switch block including at least one switch connected between the write driver and the magnetic memory cell, and at least one switch between the magnetic memory cell and a ground.

14. The magnetic memory device of claim 13, further comprising:
a variable resistance between the second transistor and the ground.

15. A magnetic memory device comprising:
a memory cell array including magnetic memory cells;
a word line, a bit line, and a source line connected to the memory cell array;
a write driver connected to the bit line and the source line, the write driver configured to receive a gate voltage;
a word line driver connected to the word line, the word line driver configured to receive the gate voltage; and
a voltage generator configured to transmit the gate voltage to the word line driver and the write driver, the voltage generator including,
a first transistor and a second transistor, a first gate of the first transistor being connected to the write driver, a second gate of the second transistor being connected to the word line driver,
a switch block connected between the first and second transistors, and
a charge pump configured to transmit the gate voltage to the first gate of the first transistor and the second gate of the second transistor.

16. The magnetic memory device of claim 15, further comprising:
a variable resistance between the second transistor and a ground.

17. The magnetic memory device of claim 16, wherein the voltage generator comprises:
a comparator;
a reference voltage generator configured to transmit a reference voltage to the comparator;
a clock generator configured to receive an active signal from the comparator and transmit a clock signal to the charge pump; and
the comparator configured to compare the reference voltage with a voltage of a node at which the second transistor and the variable resistance meet.

18. The magnetic memory device of claim 17, further comprising:
a voltage controller configured to adjust an amount of pumping of the charge pump.

* * * * *